United States Patent
Shan et al.

(10) Patent No.: US 11,527,592 B2
(45) Date of Patent: Dec. 13, 2022

(54) TERMINALS AND DISPLAY SCREENS

(71) Applicant: Yungu (Gu'an) Technology Co., Ltd., Langfang (CN)

(72) Inventors: Qi Shan, Langfang (CN); Tong Xu, Langfang (CN); Xuejing Zhu, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 155 days.

(21) Appl. No.: 16/337,930

(22) PCT Filed: May 18, 2018

(86) PCT No.: PCT/CN2018/087557
§ 371 (c)(1),
(2) Date: Mar. 29, 2019

(87) PCT Pub. No.: WO2019/062158
PCT Pub. Date: Apr. 4, 2019

(65) Prior Publication Data
US 2021/0359053 A1    Nov. 18, 2021

(30) Foreign Application Priority Data
Sep. 30, 2017    (CN) .......................... 201721280713.3

(51) Int. Cl.
*H01L 27/32*    (2006.01)
*H04M 1/02*    (2006.01)

(52) U.S. Cl.
CPC ...... *H01L 27/3262* (2013.01); *H01L 27/3216* (2013.01); *H01L 27/3218* (2013.01);
(Continued)

(58) Field of Classification Search
CPC ............. H01L 27/3262; H01L 27/3216; H01L 27/3218; H01L 27/3234; H01L 27/326;
(Continued)

(56) References Cited

U.S. PATENT DOCUMENTS

2012/0268357 A1* 10/2012 Shih ..................... G09G 3/3607
345/88
2013/0094126 A1* 4/2013 Rappoport ............ G06F 1/1637
361/679.01
(Continued)

FOREIGN PATENT DOCUMENTS

| CN | 106603772 A | 4/2017 |
|---|---|---|
| CN | 106921767 A | 7/2017 |

(Continued)

*Primary Examiner* — S M Sohel Imtiaz
(74) *Attorney, Agent, or Firm* — Kilpatrick Townsend & Stockton

(57) ABSTRACT

The present disclosure relates to terminals and display screens. In an embodiment, a terminal includes a display area, the display area includes at least two display regions, the at least two display regions include a first display region and a second display region, a pixel density of the first display region is less than a pixel density of the second display region, and the pixel density of the first display region is less than or equal to a maximum pixel density of the first display region in a transparent state when the first display region is unlit.

13 Claims, 4 Drawing Sheets

(52) U.S. Cl.
CPC ...... *H01L 27/3234* (2013.01); *H04M 1/0264*
(2013.01); *H04M 1/0266* (2013.01)

(58) Field of Classification Search
CPC .............. H04M 1/0264; H04M 1/0266; G09G
2300/0452; G09G 3/3233; G09G 3/20;
G09G 5/00; G09G 5/391; G09F 9/30
See application file for complete search history.

(56) References Cited

U.S. PATENT DOCUMENTS

| | | | | |
|---|---|---|---|---|
| 2014/0218956 | A1* | 8/2014 | Wu | G02F 1/13336 |
| | | | | 362/311.01 |
| 2014/0232722 | A1* | 8/2014 | Deluca | G09G 5/14 |
| | | | | 345/428 |
| 2015/0288888 | A1* | 10/2015 | Alsheuski | F41G 1/38 |
| | | | | 348/240.2 |
| 2015/0379945 | A1* | 12/2015 | Kubota | G02F 1/136213 |
| | | | | 345/89 |
| 2016/0064458 | A1* | 3/2016 | Lee | H01L 27/3218 |
| | | | | 345/694 |
| 2017/0193968 | A1* | 7/2017 | Wei | G02F 1/133524 |
| 2017/0353717 | A1* | 12/2017 | Zhou | H04N 13/307 |
| 2020/0006402 | A1* | 1/2020 | Endo | H01L 27/1225 |
| 2020/0195764 | A1* | 6/2020 | Xu | H04N 5/2257 |

FOREIGN PATENT DOCUMENTS

| | | |
|---|---|---|
| CN | 106935144 A | 7/2017 |
| CN | 103969864 B | 9/2017 |
| CN | 207264695 U | 4/2018 |
| EP | 1289264 A2 | 3/2003 |
| WO | 2018137386 A1 | 8/2018 |

\* cited by examiner

TERMINALS AND DISPLAY SCREENS

CROSS-REFERENCE TO RELATED APPLICATIONS

This application is a U.S. national Stage of International Application No. PCT/CN2018/087557, filed on May 18, 2018, designating the United States, which claims priority to Chinese Patent Application No. 201721280713.3, filed with the Chinese Patent Office on Sep. 30, 2017 and entitled "TERMINAL AND DISPLAY SCREEN ", the content of each of which is hereby incorporated by reference in its entirety.

FIELD

The present disclosure relates to a field of display technology, and particularly to terminals and display screens.

BACKGROUND

In the display field, full screen display technology has gradually become the mainstream, and this technology is very helpful to improve the screen ratio of the mobile phone (the relative ratio of the display screen and the front panel area of the mobile phone). In the process of achieving the full screen display, the setting of the front device such as a front camera is the most difficult. The conventional terminal needs to provide a non-display area at the top of the terminal, and the front camera is located in the non-display area. Obviously, this solution cannot achieve a full screen display of the terminal.

SUMMARY

Accordingly, it is necessary to provide terminals and display screens capable of achieving a full screen display.

According to an aspect of the present disclosure, a display screen is provided. The display screen includes a display area, and the display area includes at least two display regions. The at least two display regions include a first display region and a second display region, and a pixel density of the first display region is less than a pixel density of the second display region.

In one of the embodiments, the display screen according to claim 1, the pixel density of the first display region is less than or equal to a maximum pixel density of the first display region in a transparent state when the first display region is unlit.

In one of the embodiments, the pixel density of the first display region is less than or equal to 150 PPI.

In one of the embodiments, the difference between the pixel density of the second display region and the pixel density of the first display region is at least 300 PPI.

In one of the embodiments, the display screen includes a first end and a second end opposite to each other, the first display region is located at the first end of the display screen, and the second display region is located at the second end of the display screen.

In one of the embodiments, the first and the second display regions are provided along a direction of length of the display screen.

In one of the embodiments, the first and the second display regions are provided along a direction of width of the display screen.

In one of the embodiments, the first display region is surrounded by the second display region.

In one of the embodiments, the area of the first display region is less than the area of the second display region.

In one of the embodiments, the number of transistors in a pixel circuit of the first display region is less than the number of transistors in a pixel circuit of the second display region.

In one of the embodiments, the pixel circuit of the first display region is a 2T1C pixel circuit, and the pixel circuit of the second display region is a 7T1C pixel circuit.

In one of the embodiments, each pixel of the first display region and the second display region includes three sub-pixels. The sub-pixels included in each pixel of the first display region are arranged in parallel, and two sub-pixels included in each pixel of the second display region are arranged in parallel on one side of another sub-pixel included in the pixel.

In one of the embodiments, the number of the first display region is more than one.

According to another aspect of the present disclosure, a terminal is provided. The terminal includes a main body and a display screen provided on the main body, and the main body is to achieve an object function of the terminal.

The display screen includes a display area, the display area includes at least two display regions, the at least two display regions include a first display region and a second display region, a pixel density of the first display region is less than a pixel density of the second display region, and the pixel density of the first display region is less than or equal to a maximum pixel density of the first display region in a transparent state when the first display region is unlit.

The main body includes a front device provided under the first display region of the display screen.

The terminal further includes a controller. When it is detected that the front device is working, the controller controls the first display region to be in an unlit state, and when the front device is not working, the controller controls the first and the second display regions, such that the first and the second display regions are displayed as need to achieve a full screen display.

In one of the embodiments, the front device includes at least one of a front camera, a light sensor, and a product identification.

In one of the embodiments, the first and the second display regions are provided along a direction of length of the terminal.

In one of the embodiments, the first and the second display regions are provided along a direction of width of the terminal.

In one of the embodiments, the location of the first display region on the display screen is corresponding to the location of the front device in the terminal.

According to the aforementioned terminal and display screen, the display screen includes at least a first display region and a second display region, a pixel density of the first display region is less than a pixel density of the second display region, and the pixel density of the first display region is less than or equal to a maximum pixel density of the first display region in a transparent state when the first display region is unlit, such that the first display region is transparent in the unlit state. Therefore, when the terminal adopts the aforementioned display screen, the front device such as a front camera can be provided under the first display region. When the front camera is required to be used, it is only necessary to control the first display region to be in an unlit state. However, when the front camera is not working, since the region above the front device also belongs to the display area, all display regions of the display screen can be normally displayed, so as to truly achieve the full screen display of the terminal.

DETAILED DESCRIPTION OF THE INVENTION

In order to clarify the purpose, technical solutions and advantages of the present disclosure, the present disclosure is described in further detail below with reference to the accompanying drawings and embodiments. It should be understood that, the specific embodiments described herein are merely intended to explain the present disclosure and are not intended to limit the present application.

The display screens according to various embodiments of the present disclosure can be applied in various terminals, so as to meet the requirement of full screen display of terminals. The terminals can be a mobile phone, a tablet, a pocket PC, a computer, and the like.

Figure 1:
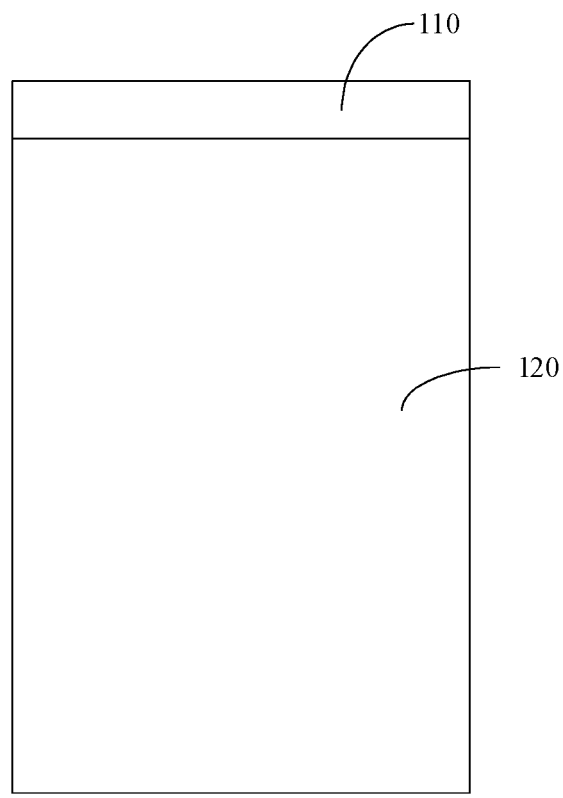
FIG. 1 is a schematic structural view of a display screen according to an embodiment of the present disclosure.

FIG. 1 is a schematic structural view of a display screen according to an embodiment. As shown in FIG. 1, in the embodiment, the display screen includes a display area, the display area includes at least two display regions, and the at least two display regions include a first display region 110 and a second display region 120. Specifically, the entire display area formed by the first display region 110 and the second display region 120 is also a screen body area of the display screen, such that the terminal using the display screen can truly realize the full screen display.

A pixel density of the first display region 110 is less than a pixel density of the second display region 120. The pixel density of the first display region 110 is less than or equal to a maximum pixel density of the first display region 110 in a transparent state when the first display region 110 is unlit. That is, the pixel density of the first display region 110 should ensure that the first display region 110 is in a transparent state when unlit. The first display region 110 being in the transparent state means that when the first display region 110 is unlit, other device (such as a front camera) under the first display region 110 can be visible to the user, and the operation of the device will not be affected by the first display region 110.

When the terminal employs the aforementioned display screen, the front device (such as the front camera) can be provided under the first display region 110. When the front camera is required to be used, it is only necessary to control the first display region 100 to be in the unlit state. However, when the front camera is not working, since the region above the front device also belongs to the display area, all display regions of the display screen can be normally displayed, so as to truly achieve the full screen display of the terminal.

In one of the embodiments, the display screen includes a first end and a second end opposite to each other. The first display region 110 is located at the first end of the display screen, and the second display region 120 is located at the second end of the display screen.

In one of the embodiments, the first display region 110 and the second display region 120 are provided along a direction of length of the terminal. The area of the first display region 110 is less than the area of the second display region 120. A size of the first display region 110 can be determined according to a size of the front device (such as the front camera) that is required to be replaced under the first display region 110. In a specific example, the width of the first display region 110 can be set as 6 mm, that is, a distance between a frame of the first display region 110 away from the second display region 120 and a frame of the second display region 120 adjacent to the first display region 110 is 6 mm.

The front device refers to the device that needs to be installed on the side of the terminal where the display screen is located, that is, the device that needs to be installed on the same side of the display screen of a conventional terminal. Specifically, the front device could be a front camera, or could be a light sensing device or a product identification displayed according to actual needs.

In one of the embodiments, the first display region 110 and the second display region 120 could also be provided along a direction of width of the terminal. In one of the embodiments, the first display region 110 can also be surrounded by the second display region 120.

Figure 2:
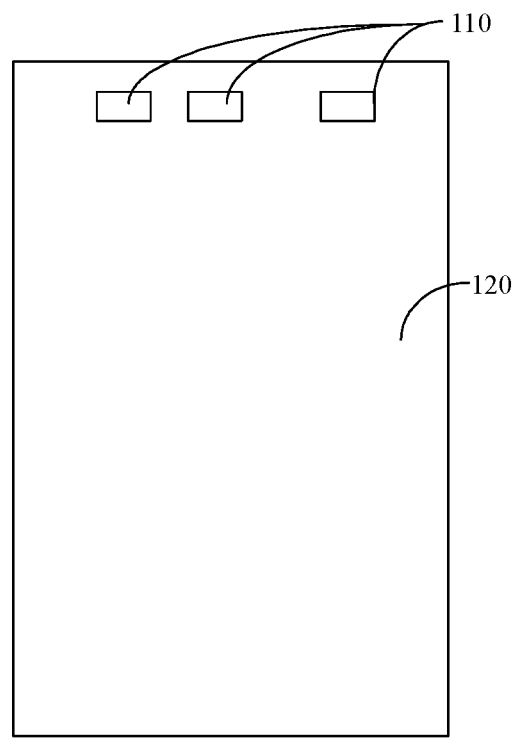
FIG. 2 is a schematic structural view of a display screen according to an embodiment of the present disclosure.

Additionally, the location of the first display region 110 on the display screen can be determined by the location of the front device in the terminal. Specifically, if a plurality of front devices are collectively provided in one area, the first display region 110 can be only one. If the plurality of front devices are dispersedly provided in a plurality of areas, as shown in FIG. 2, a plurality of first display regions 110 can be correspondingly provided, such that each of the first display regions 110 corresponds to one or more front devices.

In one of the embodiments, the pixel density of the first display region is less than or equal to 150 PPI, such that a light transmittance of the first display region 110 is above 60%, thereby ensuring the normal operation of the front device (such as the front camera).

In one of the embodiments, the pixel density of the second display region 120 is greater than the pixel density of the first display region 110 by at least 300 PPI, that is, the difference of the pixel densities between the second display region 120 and the first display region 110 is at least 300 PPI, such that the second display region 120 is in a non-transparent state when in the unlit state.

In one of the embodiments, the number of transistors in a pixel circuit of the first display region 110 is less than the number of transistors in a pixel circuit of the second display region 120. Since the pixel circuit with less transistors occupies a less light shielding area, the light transmittance of the first display region 110 can be further improved.

Figure 3:
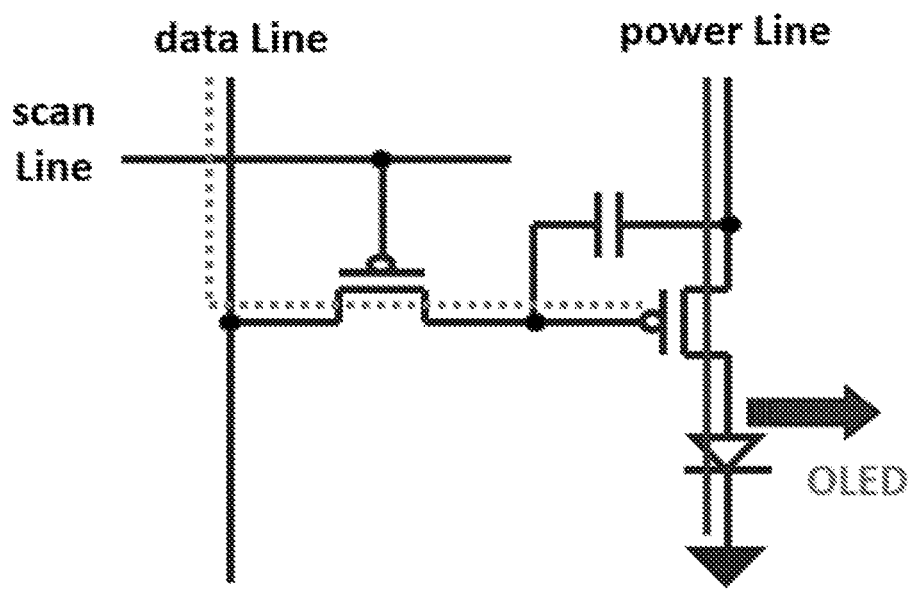
FIG. 3 is a schematic circuit diagram of a pixel circuit of a first display region according to an embodiment of the present disclosure.
Figure 4:
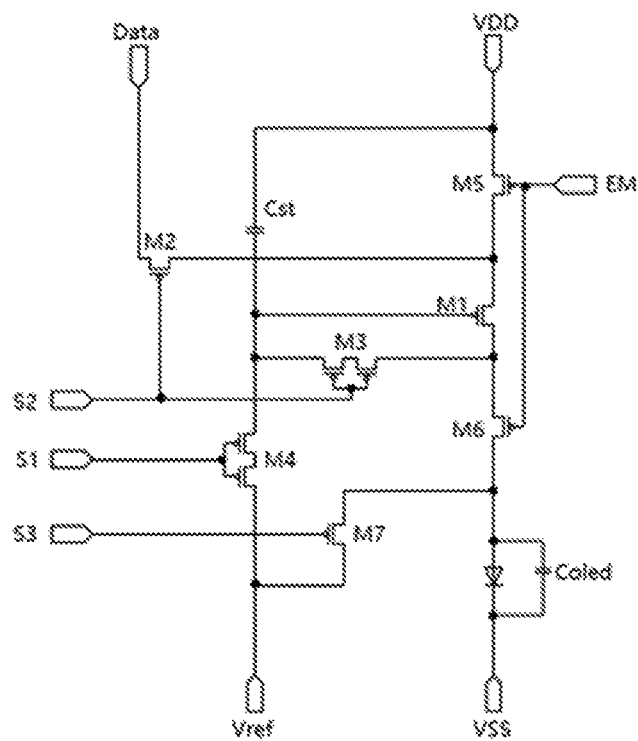
FIG. 4 is a schematic circuit diagram of a pixel circuit of a second display region according to an embodiment of the present disclosure.

In one of the embodiments, the pixel circuit of the first display region 110 is a 2T1C pixel circuit, in which T represents a transistor, C represents a capacitor, and the number before each letter represents the corresponding number. Therefore, as shown in FIG. 3, the pixel circuit of the first display region 110 includes 2 transistors and 1 capacitor. Additionally, the same meaning is also indicated in the circuit structure appearing below. As shown in FIG. 4, the pixel circuit of the second display region 120 is a 7T1C pixel circuit. The 7T1C pixel circuit and the 2T1C pixel circuit described in the present disclosure are clear to those skilled in the art, and thus the specific circuit structure of each pixel circuit will not be described in detail in the present disclosure.

Figure 5:
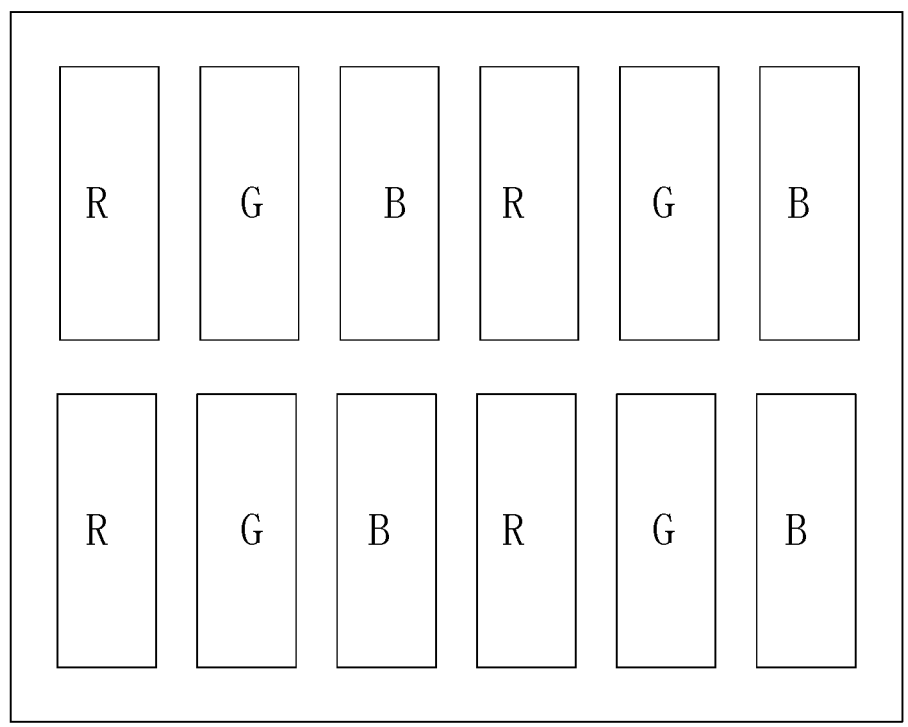
FIG. 5 is a schematic view of an arrangement of pixels of the first display region according to an embodiment of the present disclosure.
Figure 6:
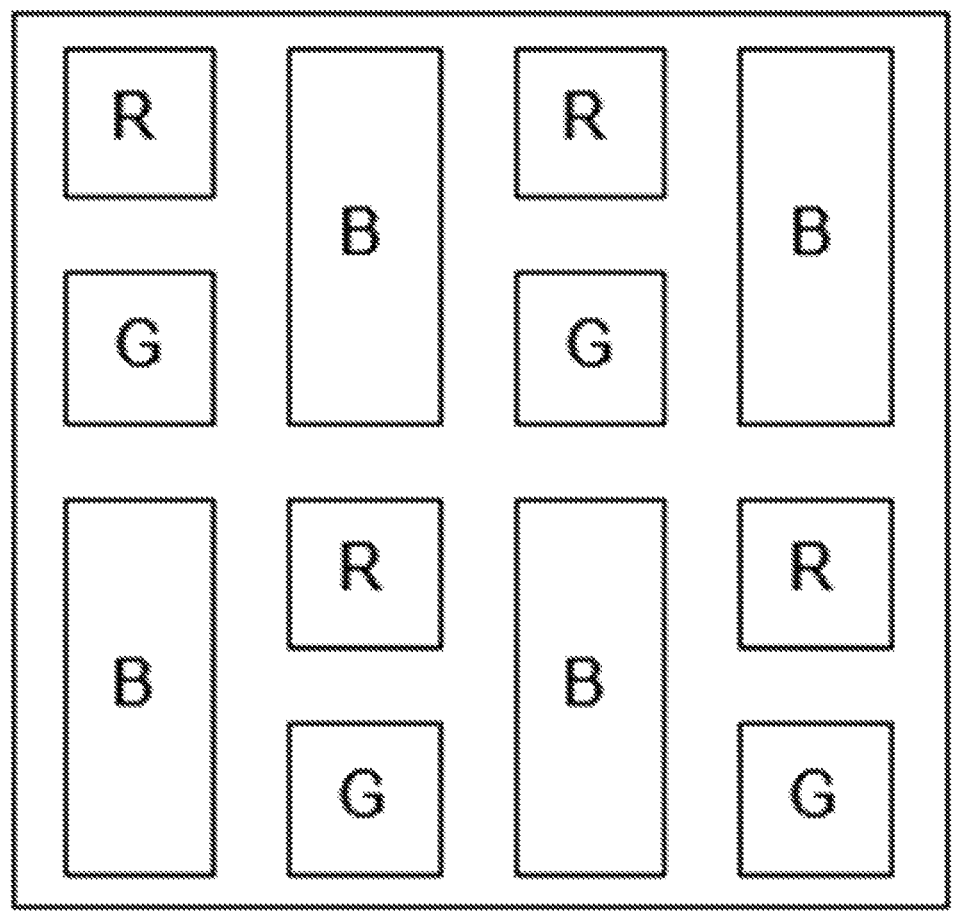
FIG. 6 is a schematic view of an arrangement of pixels of the second display region according to an embodiment of the present disclosure.

In one of the embodiments, each pixel of the first display region and each pixel of the second display region all includes three sub-pixels. Specifically, each pixel includes a red sub-pixel R, a green sub-pixel G, and a blue sub-pixel B. Moreover, as shown in FIG. 5, the sub-pixels included in each pixel of the first display region 110 are arranged in parallel, that is, the pixels included in the first display region 110 are arranged in a stripe-like arrangement structure. Additionally, as shown in FIG. 6, two sub-pixels included in each pixel of the second display region 120 are arranged in parallel on one side of another sub-pixel included in the pixel, that is, the sub-pixels included in the pixels of the second display region 120 are arranged in a V-shaped arrangement structure. In a specific example, the red sub-pixel R and the green sub-pixel G can be arranged in parallel on one side of the blue sub-pixel B. In other embodiments, the positions of each sub-pixel can be switched, and are not limited to the arrangement shown in FIG. 6.

It should be noted that, the display screen according to the embodiments of the present disclosure is not limited to be applied to the terminal employed with the front device, but also can be applied to other terminals with no front device, that is, the display screen can be applied to any one kind of terminals.

The present disclosure also provides a terminal including a main body and a display screen provided on the main body. The main body is configured to achieve an object function of the terminal. The display screen can be the display screen according to any of the aforementioned embodiments. The main body includes a controller and a front device. In one of the embodiments, the front device can be a front camera.

The operation principle of the terminal is described herein with an example that the front device is a front camera. The front camera is provided under the first display region 110. The controller detects the working state of the front camera. Therefore, when the front camera is detected to be working, the controller controls the first display region 110 to be in an unlit state. Since the first display region 110 is transparent in the unlit state, the light from outside can pass through the first display region 110 and reach the front camera, such that the normal operation of the front camera is not affected. Additionally, other areas of the display screen are independently controlled by the controller, and are not affected by the working state of the front camera. In other words, for the terminal, when the front camera is not working, the controller controls the first display region 110 and the second display region 120, such that the first display region 110 and the second display region 120 are displayed as need to achieve the full screen display. When the front camera is working, the controller controls the first display region 110 not to be lit, which means this display area is not displayed, such that the front camera is visible, and the normal operation of the front camera is not affected, and since the other display areas are independently controlled by the controller, the display process of other display areas is not affected. According to the aforementioned terminal, when the terminal is in a sleep, standby or power-off state, that is, when the display screen is unlit, the front camera is in a visible state.

The technical features of the embodiments described above can be arbitrarily combined. In order to make the description succinct, there is no describing of all possible combinations of the various technical features in the foregoing embodiments. It should be noted that there is no contradiction in the combination of these technical features which should be considered as the scope of the description.

The above-described embodiments represent only several embodiments of the present disclosure, the description of which is more specific and detailed, but is not to be construed as limiting the scope of the present disclosure. It should be noted that, a number of variations and modifications may be made by those skilled in the art without departing from the concept of the present disclosure. Therefore, the scope of the present disclosure shall be subject to the protection scope of the claims.

The invention claimed is:

1. A display screen, comprising: a display area, the display area comprising at least two display regions;
   wherein the at least two display regions comprise a first display region and a second display region, and a pixel density of the first display region is lower than a pixel density of the second display region;
   wherein the first display region comprises a first pixel including a plurality of sub-pixels arranged in parallel;
   wherein the second display region comprises at least a second pixel including a first sub-region and a second sub-region, the first sub-region is adjacent to the second sub-region in a width direction of the display screen, the first sub-region comprises a first sub-pixel and a second sub-pixel, the second sub-pixel is adjacent to the first sub-pixel in a length direction of the display screen, the second sub-region comprises a third sub-pixel such that the third sub-pixel is adjacent to both the first sub-pixel and the second sub-pixel in the width direction of the display screen;
   wherein the second display region comprises a plurality of the second pixels,
   two of the second pixels arranged along the width direction having a same pixel arrangement; and
   arrangements of the first, second sub-pixels and the third sub-pixel, in two of the second pixels arranged along the length direction, are opposite.

2. The display screen according to claim 1, wherein the pixel density of the first display region is lower than or equal to a maximum pixel density of the first display region in a transparent state when the first display region is unlit.

3. The display screen according to claim 1, wherein the pixel density of the first display region is less than or equal to 150 PPI.

4. The display screen according to claim 1, wherein a difference between the pixel density of the second display region and the pixel density of the first display region is at least 300 PPI.

5. The display screen according to claim 1, wherein the display screen comprises a first end and a second end opposite to each other, the first display region is located at the first end of the display screen, and the second display region is located at the second end of the display screen.

6. The display screen according to claim 5, wherein the first and the second display regions are provided along a direction of length of the display screen.

7. The display screen according to claim 1, wherein the first display region is surrounded by the second display region.

8. The display screen according to claim 1, wherein an area of the first display region is less than an area of the second display region.

9. The display screen according to claim 1, wherein the number of transistors in a pixel circuit of the first display region is less than the number of transistors in a pixel circuit of the second display region.

10. The display screen according to claim 1, wherein a pixel circuit of the first display region is a 2T1C pixel circuit, and a pixel circuit of the second display region is a 7T1C pixel circuit.

11. The display screen according to claim 1, wherein each pixel of the first display region and the second display region comprises three sub-pixels, the sub-pixels included in each pixel of the first display region are arranged in parallel, and two sub-pixels included in each pixel of the second display region are arranged in parallel on one side of another sub-pixel included in the pixel.

12. The display screen according to claim 1, wherein the number of the first display region is more than one.

13. The display screen according to claim 1, wherein the first display region is configured to accommodate a front device selected from the group consisting of a front camera, a light sensor, and a product identification.

* * * * *